(12) United States Patent
Gupta et al.

(10) Patent No.: US 11,776,591 B2
(45) Date of Patent: Oct. 3, 2023

(54) CONCURRENT ACCESS TECHNIQUES UTILIZING WORDLINES WITH THE SAME ROW ADDRESS IN SINGLE PORT MEMORY

(71) Applicant: Arm Limited, Cambridge (GB)

(72) Inventors: Lalit Gupta, Cupertino, CA (US); Bo Zheng, Cupertino, CA (US); El Mehdi Boujamaa, Valbonne (FR); Fakhruddin Ali Bohra, San Jose, CA (US)

(73) Assignee: Arm Limited, Cambridge (GB)

(*) Notice: Subject to any disclaimer, the term of this patent is extended or adjusted under 35 U.S.C. 154(b) by 112 days.

(21) Appl. No.: 16/584,898

(22) Filed: Sep. 26, 2019

(65) Prior Publication Data

US 2021/0098032 A1 Apr. 1, 2021

(51) Int. Cl.
*G11C 7/10* (2006.01)
*G11C 11/419* (2006.01)
*G11C 11/16* (2006.01)
*G11C 11/418* (2006.01)

(52) U.S. Cl.
CPC ........ *G11C 7/1015* (2013.01); *G11C 11/1655* (2013.01); *G11C 11/1657* (2013.01); *G11C 11/1659* (2013.01); *G11C 11/1673* (2013.01); *G11C 11/1675* (2013.01); *G11C 11/418* (2013.01); *G11C 11/419* (2013.01)

(58) Field of Classification Search
CPC .............. G11C 7/1015; G11C 11/1673; G11C 11/1655; G11C 11/419; G11C 11/418; G11C 11/1657; G11C 11/1659; G11C 11/1675; G11C 8/10; G11C 2207/2209; G11C 2207/005; G11C 2207/002; G11C 7/1075
USPC ...................... 365/189.04; 711/150, 155, 103
See application file for complete search history.

(56) References Cited

U.S. PATENT DOCUMENTS

| | | | |
|---|---|---|---|
| 5,796,659 A * | 8/1998 | Hegi | G11C 11/419 365/189.03 |
| 6,172,925 B1 | 1/2001 | Bloker | |
| 6,314,047 B1 | 11/2001 | Keay et al. | |
| 6,483,754 B1 | 11/2002 | Agrawal | |
| 6,714,472 B2 | 3/2004 | Wilkins | |
| 7,092,279 B1 * | 8/2006 | Sheppard | G11C 11/412 257/E27.098 |
| 9,858,988 B1 * | 1/2018 | Ghosh | G11C 11/419 |
| 9,870,818 B1 | 1/2018 | Garg | |
| 9,953,701 B1 | 4/2018 | Bohra et al. | |
| 10,943,670 B1 | 3/2021 | Gupta et al. | |
| 2008/0025113 A1* | 1/2008 | Kitagawa | G11C 11/4097 365/207 |
| 2010/0088484 A1* | 4/2010 | Roohparvar | G11C 7/1018 711/168 |
| 2010/0157715 A1 | 6/2010 | Pyeon | |

(Continued)

*Primary Examiner* — Tracy C Chan
(74) *Attorney, Agent, or Firm* — Pramudji Law Group PLLC; Ari Pramudji

(57) ABSTRACT

Various implementations described herein refer to a method for providing single port memory with multiple different banks having a first bank and a second bank that is different than the first bank. The method may include coupling multiple wordlines to the single port memory including coupling a first wordline to the first bank and coupling a second wordline to the second bank. The method may include performing multiple memory access operations concurrently in the single port memory.

19 Claims, 7 Drawing Sheets

(56) References Cited

U.S. PATENT DOCUMENTS

| | | | |
|---|---|---|---|
| 2011/0317484 A1* | 12/2011 | Choi .................... | G11C 7/12 |
| | | | 365/163 |
| 2013/0121086 A1* | 5/2013 | Terzioglu ............ | G06F 13/1663 |
| | | | 365/189.04 |
| 2013/0141992 A1* | 6/2013 | Lee ..................... | G11C 7/18 |
| | | | 365/189.011 |
| 2014/0119130 A1 | 5/2014 | Trivedi et al. | |
| 2015/0070961 A1* | 3/2015 | Katayama ........... | G11C 11/1655 |
| | | | 365/66 |
| 2015/0121030 A1* | 4/2015 | Lin ..................... | G11C 7/18 |
| | | | 711/170 |
| 2015/0131365 A1 | 5/2015 | Hsieh et al. | |
| 2015/0254009 A1* | 9/2015 | Eguchi ................ | G06F 3/0688 |
| | | | 711/103 |
| 2015/0310904 A1* | 10/2015 | Kim .................... | G11C 7/1042 |
| | | | 365/158 |
| 2016/0055905 A1* | 2/2016 | Lee .................... | G11C 13/0038 |
| | | | 365/148 |
| 2020/0034054 A1* | 1/2020 | Zamsky ............... | G06F 3/0631 |
| 2020/0327932 A1 | 10/2020 | Verma et al. | |
| 2021/0110853 A1 | 4/2021 | Gupta et al. | |

\* cited by examiner

CONCURRENT ACCESS TECHNIQUES UTILIZING WORDLINES WITH THE SAME ROW ADDRESS IN SINGLE PORT MEMORY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Memory compilers utilize configuration data to generate physical layout designs of memory circuitry for read and write access operations. Traditional memory compilers examine characterized data to develop various memory instances that cover the memory compiler space. However, some traditional techniques typically introduce accuracy errors in reference to memory instance data. In some cases, various leakage, timing, power and noise data for the memory instances is stored, and some traditional memory compilers typically analyze error prone memory instances related to entire memory circuits, gather results and then compute a final result. However, traditional techniques are costly, time consuming and inefficient, and traditional techniques may cause accuracy errors because some memory instances are sensitive to a number of rows (e.g., bitcells, columns, and/or wordline drivers). Also, in some cases, only a single wordline in one bank is accessible in some bank architectures, wherein users perform either a read operation or a write operation. Thus, there exists a need to improve physical design implementation of some memory circuits to provide for more efficient read and write access operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are related to read and write memory access schemes and techniques that improve read and write access in physical layout designs. For instance, various schemes and techniques described herein may provide for a system or device having a unique single port memory architecture that supports dual wordline circuitry. In some instances, various schemes and techniques described herein may be configured to perform multiple memory access operations concurrently in single port memory, such as, e.g., performing a read operation in a first bank array using a first wordline while performing a write operation in a second bank array using another second wordline, or performing a write operation in the first bank array using the first wordline while performing a read operation in the second bank array using the second wordline.

Various implementations of read and write access schemes and techniques will be described in detail herein with reference to FIGS. 1A-5.

Figure 1A:
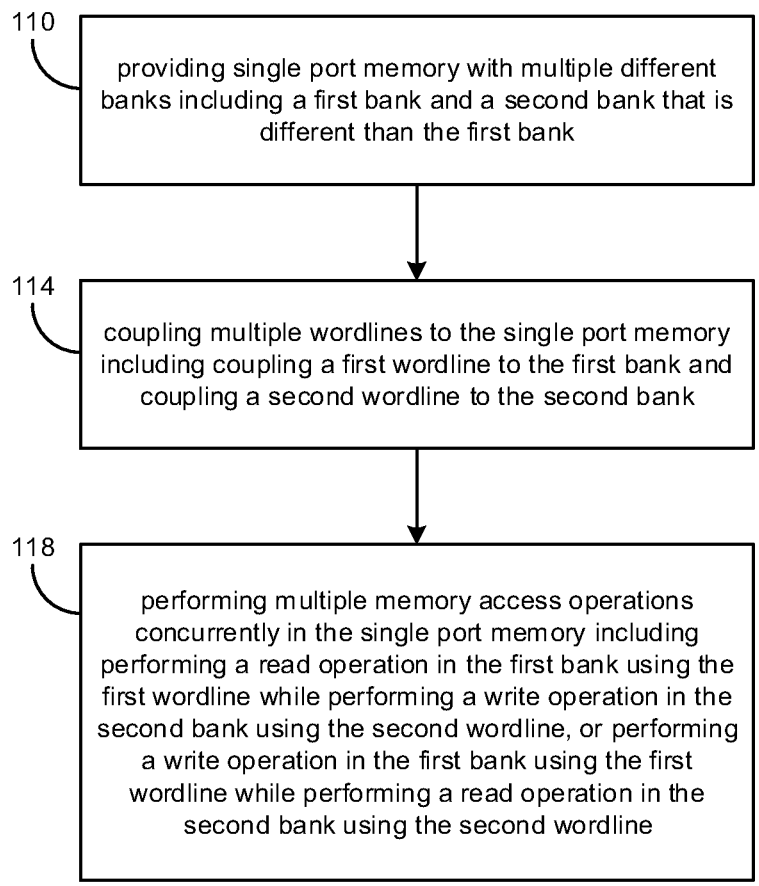
FIGS. 1A-1B illustrate process diagrams of methods for utilizing dual wordline circuitry in accordance with implementations described herein.
Figure 1B:
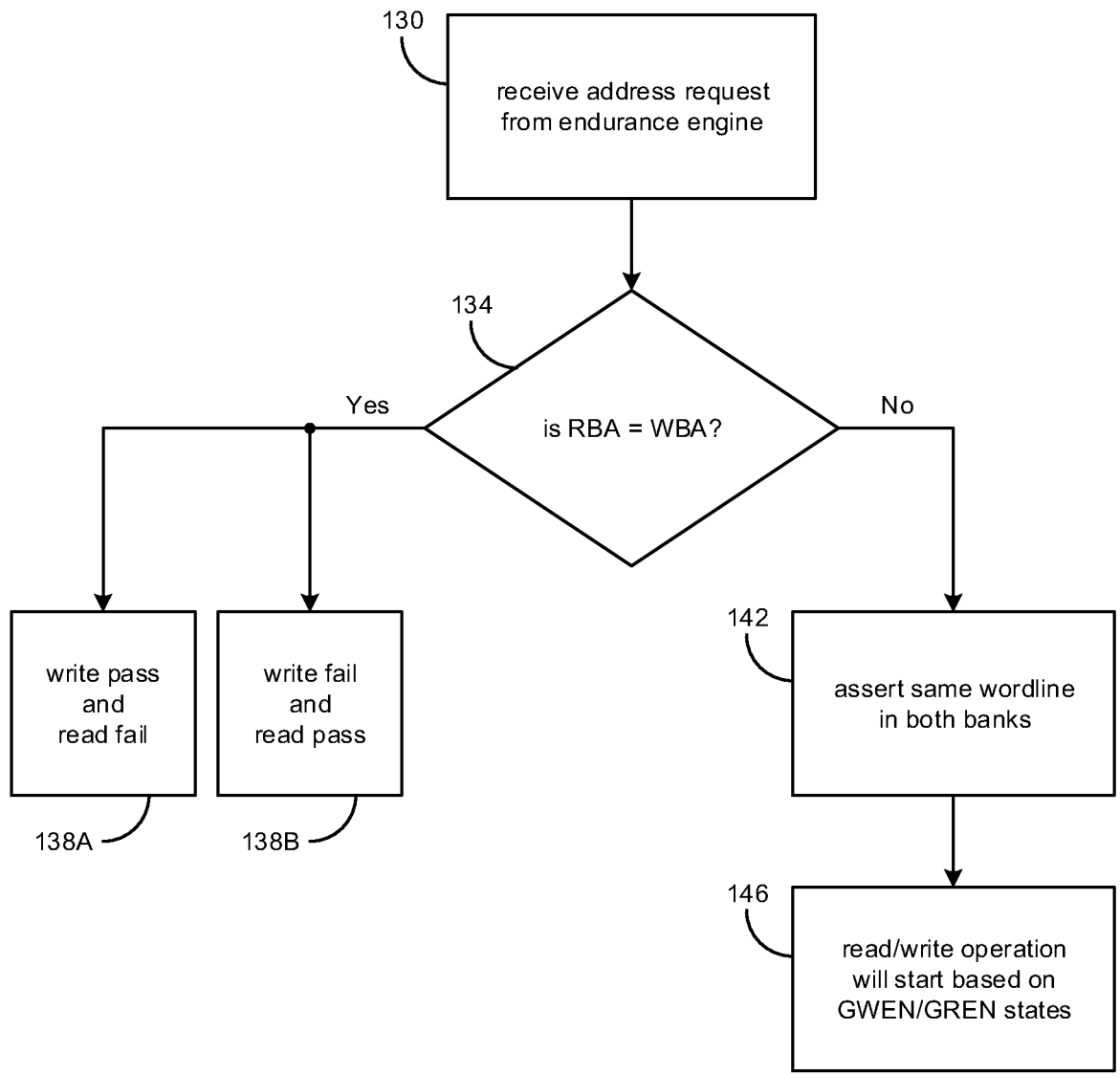

FIGS. 1A-1B illustrate process diagrams of methods for utilizing dual wordline circuitry in accordance with implementations described herein. In some implementations, FIG. 1A illustrates a process diagram 102A of a method 100A for read and write memory access with dual wordlines, and also, FIG. 1B illustrates another process diagram 102B of a method 100B for read and write memory access with dual wordlines.

It should be understood that even though methods 100A-100B may indicate a particular order of operation execution, in some cases, various portions of the operations may be executed in a different order, and on different systems. In other cases, additional operations and/or steps may be added to and/or omitted from methods 100A-100B Also, methods 100A-100B may be implemented in hardware and/or software. If implemented in hardware, methods 100A-100B may be implemented with various components and/or circuitry, as described herein below in reference to FIGS. 2A-5. Also, if implemented in software, methods 100A-100B may be implemented as various programs and/or software instruction processes that are configured for various read and write access schemes and techniques, as described herein. Also, if implemented in software, instructions related to implementing methods 100A-100B may be stored in memory and/or a database. Also, in other instances, a computer or various other types of computing devices having at least one processor and memory may be configured to perform methods 100A-100B.

In reference to FIG. 1A, in block 110, method 100A may provide single port memory with multiple different banks having, e.g., a first bank and a second bank that is different than the first bank. In block 114, method 100A may couple multiple wordlines to the single port memory including coupling a first wordline to the first bank and coupling a second wordline to the second bank.

In block 118, method 100A may perform multiple memory access operations concurrently in the single port memory. For instance, method 100A may perform a read operation in the first bank using the first wordline while performing a write operation in the second bank using the second wordline. In another instance, method 100A may perform a write operation in the first bank using the first wordline while performing a read operation in the second bank using the second wordline.

In some implementations, method 100A may use the same memory address to perform the multiple memory access operations concurrently in the single port memory, wherein the same memory address may refer to the same row address in the first bank and in the second bank. In some instances, the same memory location in the first bank and in the second bank may be used to concurrently perform the multiple memory access operations in the single port memory. The read operation may be performed in the first bank with a memory address while the write operation is performed concurrently in the second bank with the same memory address. The write operation may be performed in the first bank with the memory address while the read operation is performed concurrently in the second bank with the same memory address.

In some implementations, method 100A may use a global write enable signal (GWEN) along with a write bank address (WBA), a row address, and a column address to perform the write operation in the first bank or the second bank, and also, method 100A may use a global read enable signal (GREN) along with a read bank address (RBA), the row address, and the column address to perform the read operation in the first bank or the second bank. In some instances, the first bank may include an array of bitcells arranged in columns and rows, and also, the second bank may have another array of bitcells arranged in columns and rows. Further, in some instances, the single port memory may refer to static random access memory (SRAM) or magneto-resistive RAM (MRAM), and the bitcells may refer to SRAM bitcells or MRAM bitcells, respectively.

In reference to FIG. 1B, in block 130, method 100B may receive an address request from some type of computing device that may operate as an endurance engine, or some other processing component. In some instances, the address request may refer to the read bank address (RBA) and/or the write bank address (WBA). The address request may also refer to the row address and/or the column address.

In decision block 134, method 100B may decide whether the read bank address (RBA) is equal to (or at least similar to) the write bank address (WBA). In some instances, if yes, then in block 138A, method 100B may pass the write operation and fail the read operation, and/or in other instances, if yes, in block 138B, then method 100B may fail the write operation and pass the read operation. Otherwise, if no, then in block 142, method 100B may assert the same wordline in the multiple banks, such as, e.g., the first bank and the second bank. Next, in block 146, method 100B may perform read/write operations, which may be started based on the GWEN/GREN signals.

Figure 2:
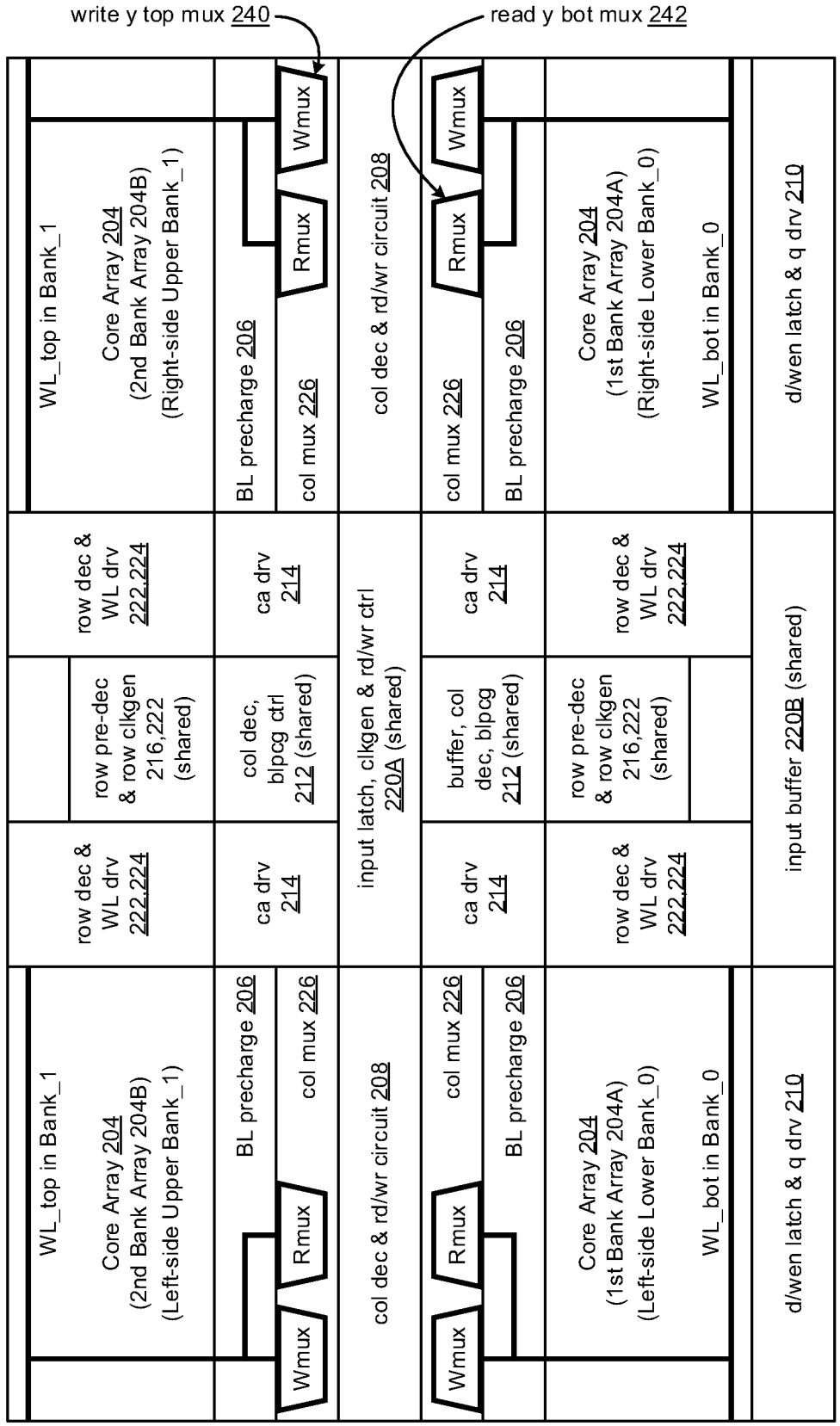
FIG. 2 illustrates a diagram of memory circuitry in accordance with various implementations described herein.

FIG. 2 illustrates a diagram of memory circuitry 200 for read and write access in accordance with various implementations described herein. In various instances, the memory circuitry 200 may refer to a device having single port memory architecture with a multiple wordlines and logic circuitry fabricated with various physical cell layout schemes and techniques as described herein. Also, the single port memory architecture may be fabricated with the read and write access schemes and techniques described herein for the physical cell layout of the memory architecture.

The memory circuitry 200 shown in FIG. 2 may include multiple memory core arrays 204, such as, e.g., a quad core array. However, in various other instances, a single core array and/or a dual core array may be used in some embodiments. Thus, as shown in FIG. 2, the memory instance 200 may include four memory instances (e.g., multiple core arrays 204 in a quad memory core configuration), and the four memory instances may share one or more control cells, such as, e.g., row pre-dec & row clk gen 216, 222, col dec, blpcg ctrl 212, input latch, clkgen & rd/wr ctrl 220A, and input buffer 220B, which represent shared circuit components.

As shown in FIG. 2, the memory circuitry 200 may be implemented with one or more memory blocks with various categories of control cells arranged to provide various memory related components. The memory circuitry 200 may include a first category (cat-1) of control cells that are arranged to provide core array circuitry 204 along with bitline (BL) precharge circuitry 206. The memory circuitry 200 may be implemented with memory circuitry having multiple core arrays 204 in a quad bank configuration, wherein each bank has an array of memory cells or bitcells. Each bitcell may be configured to store at least one data bit value (e.g., data value related to a logical '0' or '1'). Also, the core arrays 204 include any number of bitcells arranged in various configurations, such as, e.g., a two-dimensional (2D) memory array having any number of columns and any number of rows of multiple bitcells, which may be arranged in a 2D grid pattern for read and write memory access. Each bitcell may be implemented with any type of memory, including, e.g., static random access memory (SRAM), magneto-resistive RAM (MRAM), and/or any other type of memory. For instance, each bitcell may include a multi-transistor static RAM (SRAM) cell, including various types of SRAM cells, such as, e.g., 6T CMOS SRAM and/or any other type of complementary MOS (CMOS) SRAM cells, such as, e.g., 4T, 8T, 10T, or more transistors per bit. In other instances, each bitcell may include a multi-layer MRAM bitcell having free-layers and pinned layers.

The memory circuitry 200 may include a second category (cat-2) of control cells that are coupled to the first category (cat-1) of control cells, and the second category (cat-2) of control cells may be arranged to provide read-write circuitry 208 (i.e., rd/wr circuit) for accessing data stored in memory cells of the core array circuitry 204. The read-write circuitry 208 may include latch and output drive circuitry 210 (i.e., d/wen latch & q drv).

The memory circuitry 200 may include a third category (cat-3) of control cells that are coupled to the first category (cat-1) of control cells and the second category (cat-2) of control cells, and the third category (cat-3) of control cells are arranged to provide control circuitry 212, 214 for controlling access to the data stored in the memory cells of the core array circuitry 204 and for controlling operation of the read-write circuitry 208. The control circuitry 212, 214 may include bitline precharge control (i.e., blpcg) 212 and column driver (i.e., ca drv) and read-write control 214 (i.e., rd/wr ctrl) along with a row predecoder 216 (i.e., row pre-dec), a row driver 218 (i.e., ra drv), and a input buffer and latch along with clock generation 220 (i.e., input buffer & latch, clkgen).

The memory circuitry 200 may also include a row decoder 222 (i.e., row dec), a wordline driver 224 (i.e., WL drv), and a column multiplexer 226 (i.e., col mux), which may or may not part of the multiple categories (cat-1, cat-2, cat-3) of control cells. In some instances, the row decoder 222 (i.e., row dec) may be used to access each of the bitcells via a selected wordline (WL) that is driven by the wordline driver 224 (i.e., WL drv). Also, the combination of the row decoder 222 (i.e., row dec) and the wordline driver 224 (i.e., WL drv) may be referred to as (wdx).

The column multiplexer 226 (i.e., col mux or colmux) may be used to access each of the bitcells via one or more selected bitlines BL, . . . , BLn. In some instances, the selected bitlines BL, . . . , BLn may include a selected pair of complementary bitlines BL/NBL, . . . , BLn/NBLn. The row decoder 222 (i.e., row dec) may be coupled to the wordline driver 224 (i.e., WL drv) and the column multiplexer 226 (i.e., col mux) to select one or more bitcells in the core arrays 204 with one or more wordline (WL) signals and one or more bitline (BL) signals. Also, in some instances, the column multiplexer 226 (i.e., col mux) and/or components associated therewith (e.g., 206, 208, 210) may receive one or more data signals (D) and one or more other I/O signals (Q)

that are associated with reading and writing data to the bitcells in the core arrays 204.

In some implementations, as shown in FIG. 2, the memory circuitry 200 may include single port memory architecture having multiple bitcell arrays 204 with a first bitcell array 204A (e.g., lower bank array Bank_0) and a second bitcell array (e.g., upper bank array Bank_1) that is different than the first bitcell array 204. In some instances, the upper bank array (Bank_0) may be referred to as a bottom bank array, and also, the lower bank array (Bank_1) may be referred to as a lower bank array. Also, as shown in FIG. 2, the bank arrays 204, 204A, 204B may be relatively disposed as upper/top and lower/bottom (or bot) configurations and as right-side and left-side configurations.

The memory circuitry 200 may include multiple wordlines (WL) that are coupled to the single port memory architecture including a first wordline (e.g., WL_bot in Bank_0) that is coupled to the first bitcell array 204A (e.g., lower bank array Bank_0) and a second wordline (e.g., WL_top in Bank_1) that is coupled to the second bitcell array 204B (e.g., upper bank array Bank_1). As shown in FIG. 2, the column multiplexer 226 may include a write multiplexer (i.e., Wmux) and a read multiplexer (i.e., Rmux) that are coupled to the multiple wordlines (WL). For instance, the first wordline (e.g., WL_bot in Bank_0) may be coupled to the write mux (Wmux) and the read mux (Rmux) in the lower colmux 226, and the second wordline (e.g., WL_top in Bank_1) may be coupled to the write mux (Wmux) and the read mux (Rmux) in the upper colmux 226.

In some implementations, the memory circuitry 200 may include multiple write multiplexers (e.g., write y top/bot mux 240 in colmux 226) and multiple read multiplexers (e.g., read y top/bot mux 242 in colmux 226). As shown in FIG. 2, the first bank arrays 204A may include lower/bottom wordlines (e.g., WL_bot in Bank_0) that are coupled to the lower write mux (e.g., Wmux: write y bot mux 240) in colmux 226 and also coupled to the lower read mux (e.g., Rmux: read y bot mux 242) in colmux 226. Also, the second bank arrays 204B may include upper/top wordlines (e.g., WL_top in Bank_1) that are coupled to the upper write mux (e.g., Wmux: write y top mux 240) in colmux 226 and also coupled to the upper read mux (e.g., Rmux: read y top mux 242) in colmux 226. Further scope and disclosure related to the write multiplexers (Wmux) and the read multiplexers (Rmux) are described in greater detail herein below in reference to FIG. 4.

The memory circuitry 200 may include logic circuitry (e.g., some combination of 206, 208, 216, 222, 224, 226) that may be configured to perform multiple memory access operations concurrently in the single port memory architecture including performing a read operation (e.g., via Rmux) in the first bitcell array 204A (lower bank array Bank_0) using the first wordline (WL_bot in Bank_0) while performing a write operation (e.g., via Wmux) in the second bitcell array 204B (upper bank array Bank_1) using the second wordline (WL_top in Bank_1), or performing a write operation (e.g., via Wmux) in the first bitcell array 204A (lower bank array Bank_0) using the first wordline (WL_bot in Bank_0) while performing a read operation (e.g., via Rmux) in the second bitcell array 204B (upper bank array Bank_1) using the second wordline (WL_top in Bank_1).

In some implementations, the same memory address may be used to perform the multiple memory access operations concurrently in the single port memory, and the same memory address may refer to the same row address in the first bitcell array 204A (lower or bottom bank array Bank_0) and the second bitcell array 204B (upper or top bank array Bank_1). In some instances, the read operation may be performed in the first bitcell array 204A with a memory address while the write operation is performed concurrently in the second bitcell array 204B with the memory address, and also, the write operation may be performed in the first bitcell array 204A with a memory address while the read operation is performed concurrently in the second bitcell array 204B with the memory address. Also, a global write enable signal (GWEN) along with a row address may be used to perform the write operation in the first bitcell array 204A or the second bitcell array 204B, and a global read enable signal (GREN) along with a row address may be used to perform the read operation in the first bitcell array 204A or the second bitcell array 204B. In some instances, the GWEN and GREN signals are gated with a decoded Y select line, wherein GREN may be gated with COLM address bit and internal gtp to generate YPR<0:N> for the READ Y-mux. Similarly, GWEN may be gated with COLM address bit and internal gtp to generate YPW<0:N> for the Write Y-mux.

Figure 3A:
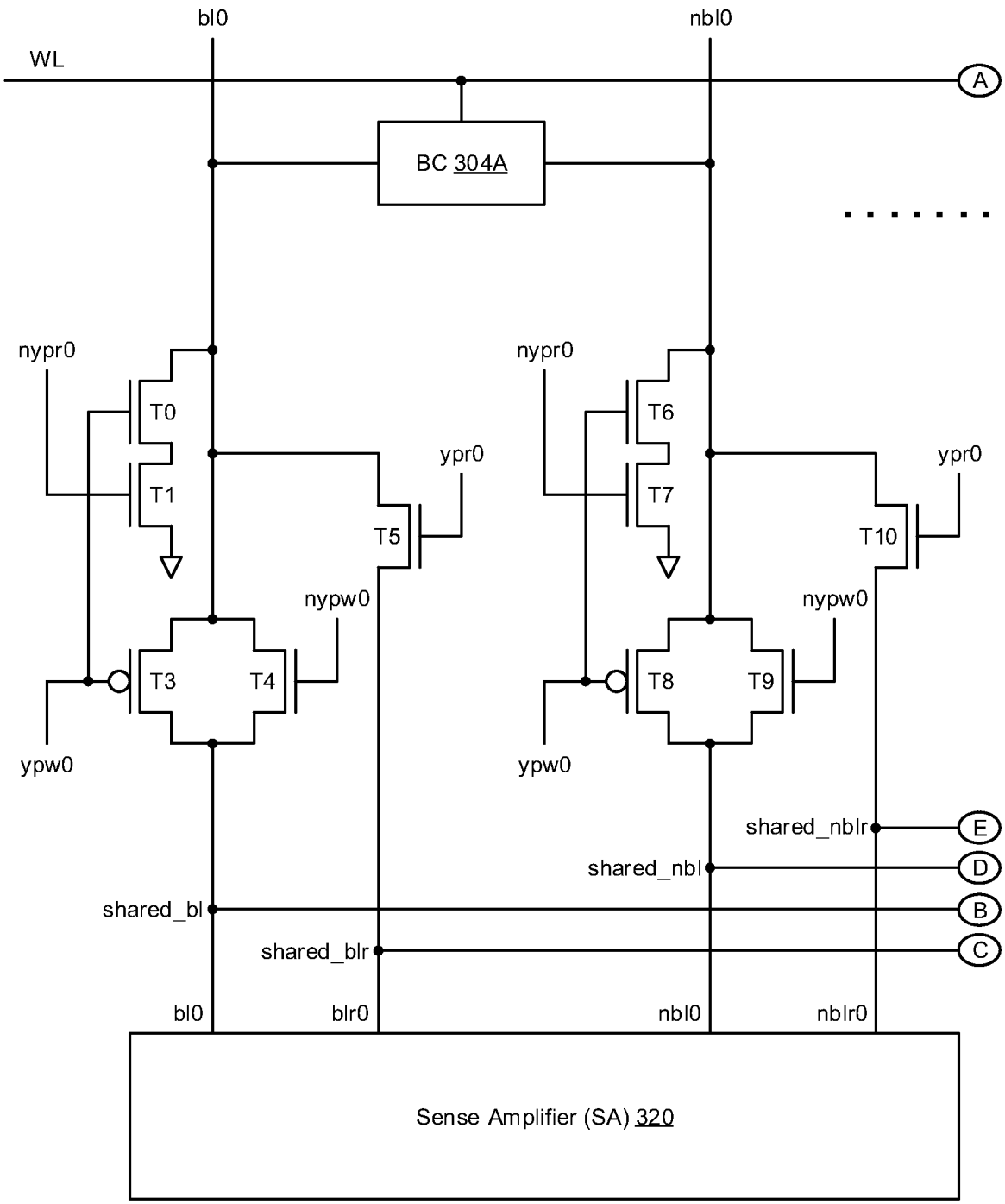
FIGS. 3A-3B illustrate column multiplexer circuitry in accordance with various implementations described herein.
Figure 3B:
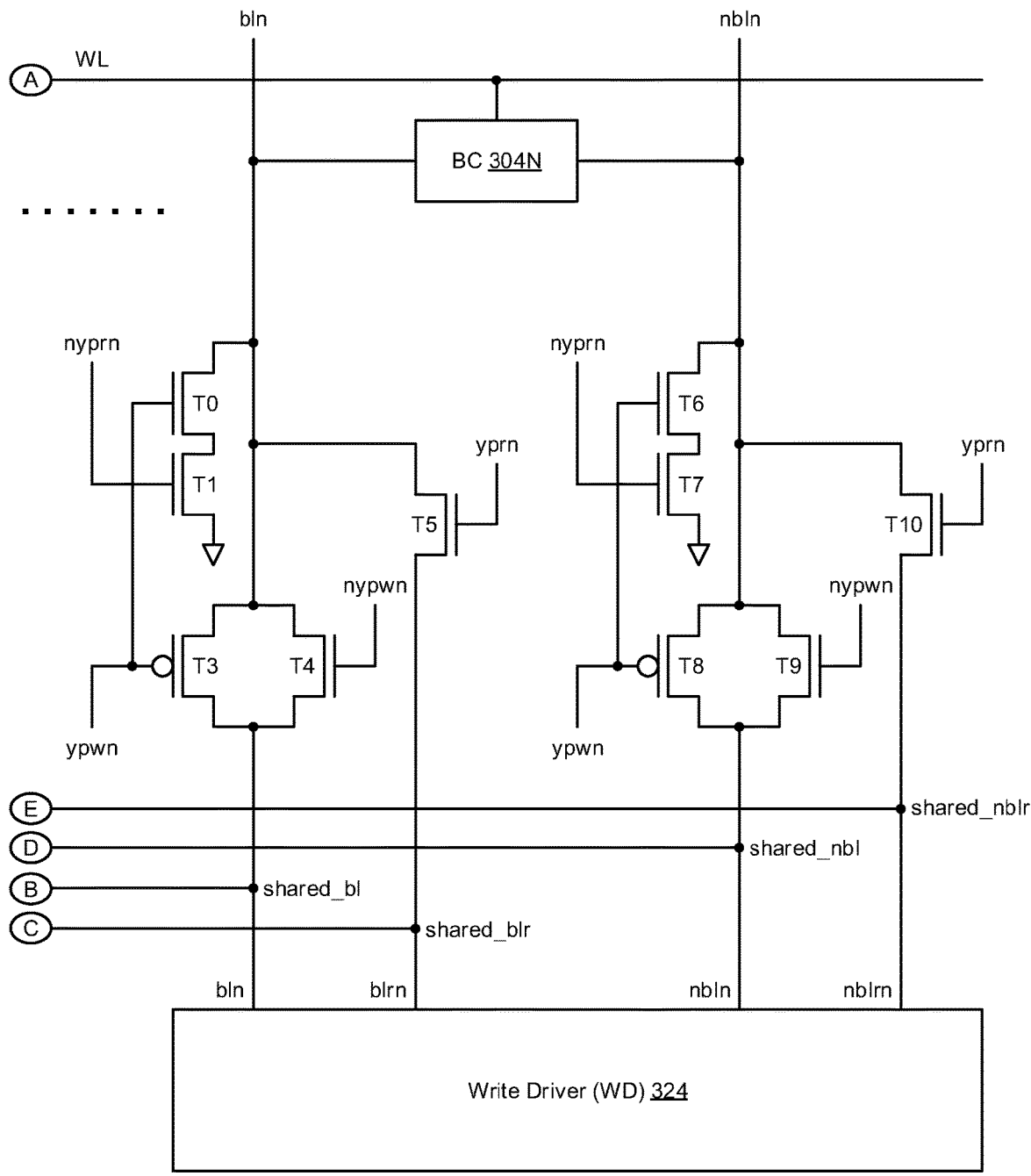

FIGS. 3A-3B illustrate column multiplexer circuitry 300 in accordance with various implementations described herein. In particular, FIG. 3A illustrates a first part 300A of the column multiplexer circuitry 300, and FIG. 3B illustrates a second part 300B of the column multiplexer circuitry 300. As shown in FIGS. 3A-3B, the first part 300A is coupled to the second part 300B via encircled elements A, B, C, D, E.

In reference to FIG. 3A, the first part 300A of the column multiplexer circuitry 300 may refer to a transistor-level dual y mux 302A. The first part 300A may include at least one bitcell 304A and a sense amplifier 320 coupled to complementary bitlines (bl0, nbl0), and a wordline (WL) may also be coupled to the at least one bitcell 304A. The first part 300A may include precharge transistors (T0, T1) coupled in series to the bitline (bl0), wherein transistor (T0) is coupled between bitline (bl0) and transistor (T1), and transistor (T1) is coupled between transistor (T0) and ground (Vss or Gnd). The gate of transistor (T0) is coupled to the gate of pass transistor (T3), and the gate of transistor (T1) receives a read activation signal (nypr0). The first part 300A may include pass transistors (T3, T4) that are coupled in parallel between bitline (bl0) and the sense amplifier (SA) 320, wherein the gate of transistor (T3) receives a write activation signal (ypw0), and also, the gate of transistor (T4) receives a complementary write activation signal (nypw0). In addition, the first part 300A may include another pass transistor (T5) that is also coupled between the bitline (bl0) and the sense amplifier (SA) 320, and the gate of transistor (T5) receives a complementary read activation signal (ypr0).

Further, in reference to bitline (nbl0), the first part 300A may include precharge transistors (T6, T7) coupled in series to the bitline (nbl0), wherein transistor (T6) is coupled between bitline (nbl0) and transistor (T7), and transistor (T7) is coupled between transistor (T6) and ground (Vss or Gnd). The gate of transistor (T6) is coupled to the gate of pass transistor (T8), and the gate of transistor (T7) receives the read activation signal (nypr0). The first part 300A may also include pass transistors (T8, T9) that are coupled in parallel between bitline (nbl0) and sense amplifier (SA) 320, wherein the gate of transistor (T8) receives the write activation signal (ypw0), and also, the gate of transistor (T9) receives the complementary write activation signal (nypw0). In addition, the first part 300A may include another pass transistor (T10) that is also coupled between the bitline (nbl0) and the sense amplifier (SA) 320, and the gate of transistor (T10) receives the complementary read activation signal (ypr0).

In some implementations, the first part 300A refers to a first column structure in an array of bitcells, and the second part 300B refers another column structure in the same array of bitcells. The array of bitcells may include any number (N) of columns and any number (N) of column structure to support read and write memory access operations as described herein. Therefore, as shown in FIGS. 3A-3B, the second part 300B may have similar components with similar scope and features as the first part 300A.

In FIG. 3B, the second part 300B of the column multiplexer circuitry 300 may refer to another transistor-level dual y mux 302B. The second part 300B may include at least one bitcell 304N and a write driver 324 coupled to complementary bitlines (bln, nbln), and the wordline (WL) may also be coupled to the at least one bitcell 304B. Similar to the first part 300A, the second part 300B may include precharge transistors (T0, T1) coupled in series to the bitline (bln), wherein transistor (T0) is coupled between bitline (bln) and transistor (T1), and transistor (T1) is coupled between transistor (T0) and ground (Vss or Gnd). The gate of transistor (T0) is coupled to the gate of pass transistor (T3), and the gate of transistor (T1) receives a read activation signal (nyprn). The second part 300B may include pass transistors (T3, T4) that are coupled in parallel between bitline (bln) and the write driver (WD) 324, wherein the gate of transistor (T3) receives a write activation signal (ypwn), and the gate of transistor (T4) receives a complementary write activation signal (nypwn). Also, the second part 300B may include another pass transistor (T5) that is also coupled between the bitline (bln) and the write driver (WD) 324, and the gate of transistor (T5) receives a complementary read activation signal (yprn).

Also, in reference to bitline (nbln), the second part 300B may include precharge transistors (T5, T6) coupled in series to the bitline (bln), wherein transistor (T5) is coupled between bitline (bln) and transistor (T6), and transistor (T6) is coupled between transistor (T5) and ground (Vss or Gnd). The gate of transistor (T5) is coupled to the gate of pass transistor (T8), and the gate of transistor (T7) receives a read activation signal (nyprn). The second part 300B may include pass transistors (T8, T9) that are coupled in parallel between bitline (bln) and the write driver (WD) 324, wherein the gate of transistor (T8) receives the write activation signal (ypwn), and also, the gate of transistor (T9) receives the complementary write activation signal (nypwn). In addition, the second part 300B may include another pass transistor (T10) that is also coupled between the bitline (bln) and the write driver (WD) 324, and also, the gate of transistor (T10) receives the complementary read activation signal (yprn).

In some implementations, as shown in FIGS. 3A-3B, the wordline (WL) may be coupled together via encircled element A. Bitline (bl0) in the first part 300A and bitline (bln) in the second part 300B may be coupled together as a shared bitline (shared_bl) via the encircled element B, and read bitline (blr0) in the first part 300A and read bitline (Urn) in the second part 300B may be coupled together as a shared read bitline (shared_blr) via the encircled element C. Further, bitline (nbl0) in the first part 300A and bitline (nbln) in the second part 300B may be coupled together as another shared bitline (shared_nbl) via the encircled element D, and read bitline (nblr0) in the first part 300A and read bitline (nblrn) in the second part 300B may be coupled together as another shared read bitline (shared_nblr) via the encircled element E.

Figure 4:
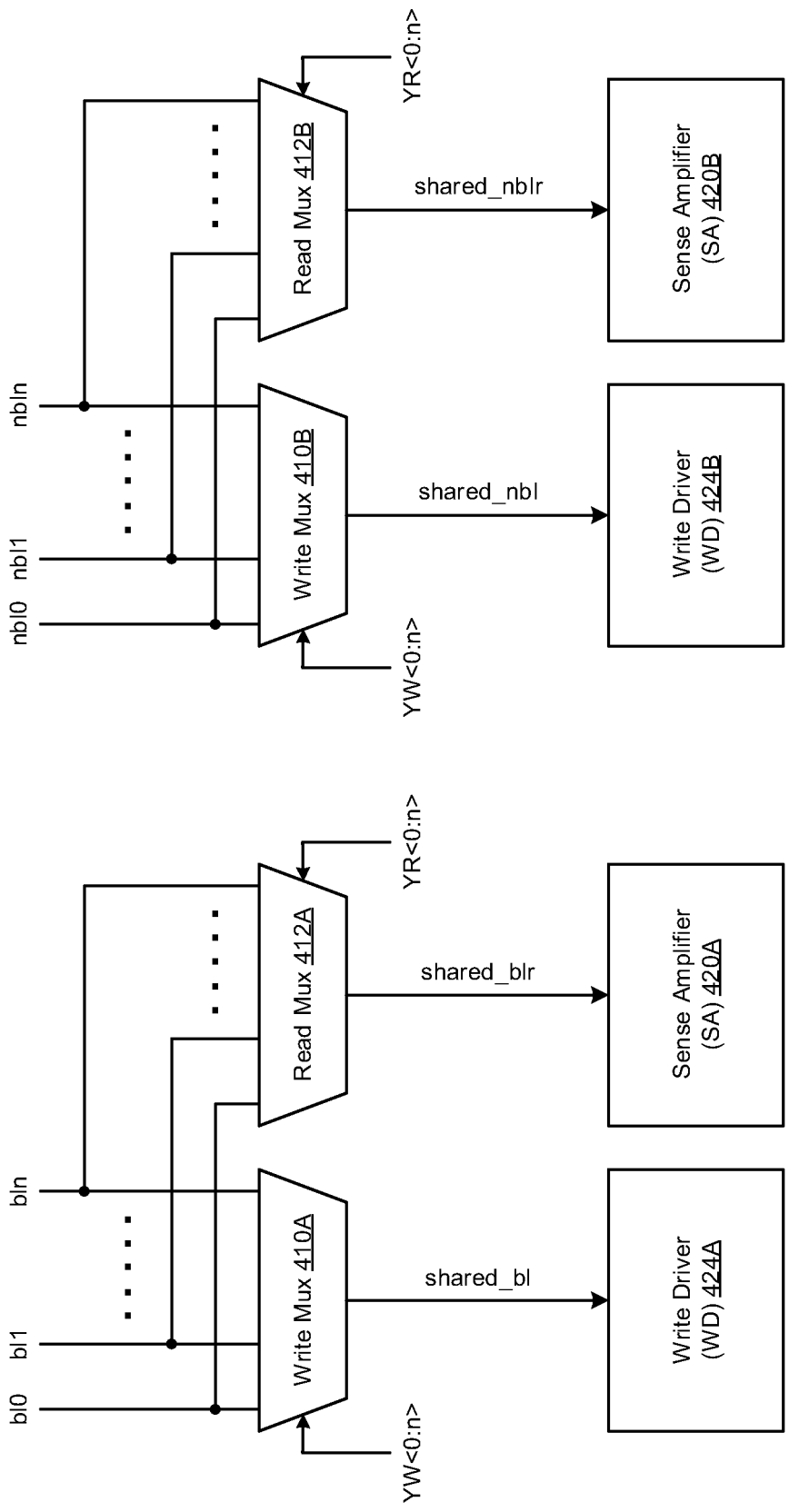
FIG. 4 illustrates a diagram of column multiplexer circuitry in accordance with various implementations described herein.

FIG. 4 illustrates a diagram of column multiplexer circuitry 400 in accordance with implementations described herein. In some implementations, the column multiplexer circuitry 400 may be referred to as a transistor-level colmux 402.

As shown in FIG. 4, the colmux 402 may include multiple circuit components that are arranged for read and write access of memory, and in this instance, the colmux 402 may include a first write mux 410A, a first read mux 412A, a first write driver (WD) 424A, and a first sense amplifier (SA) 420A. The colmux 402 may include any number (n) of multiple bitlines (bl0, bl1, . . . , bln) that are coupled to the first write mux 410A and the first read mux 412A. In some instances, the first write mux 410A receives multiple bitline signals from the multiple bitlines (bl0, bl1, . . . , bln) and provides an output write signal as a shared bitline signal via a shared bitline (shared_bl) to the first write driver 424A based on a write select signal (YW<0:n>). Also, the first read mux 412A receives multiple bitline signals from the multiple bitlines (bl0, bl1, . . . , bln) and provides an output read signal as a shared bitline signal via a shared read bitline (shared_blr) to the first sense amplifier 420A based on a read select signal (YR<0:n>).

In some instances, as shown in FIG. 4, the colmux 402 may include multiple complementary circuit components arranged for read and write access of memory, and in this instance, the colmux 402 may include a second write mux 410B, a second read mux 412B, a second write driver (WD) 424B, and a second sense amplifier (SA) 420B. The colmux 402 may include any number (n) of complementary bitlines (nbl0, nbl1, . . . , nbln) that are coupled to the second write mux 410B and the second read mux 412B. In some instances, the second write mux 410B receives multiple complementary bitline signals from the complementary bitlines (nbl0, nbl1, . . . , nbln) and provides a complementary output write signal as a shared bitline signal via a shared bitline (shared_nbl) to the second write driver 424B based on the write select signal (YW<0:n>). The second read mux 412A also receives the multiple bitline signals from the complementary bitlines (nbl0, nbl1, . . . , nbln) and provides a complementary output read signal as a shared complementary bitline signal via a shared read bitline (shared_nblr) to the second sense amplifier 420A based on the read select signal (YR<0:n>).

Figure 5:
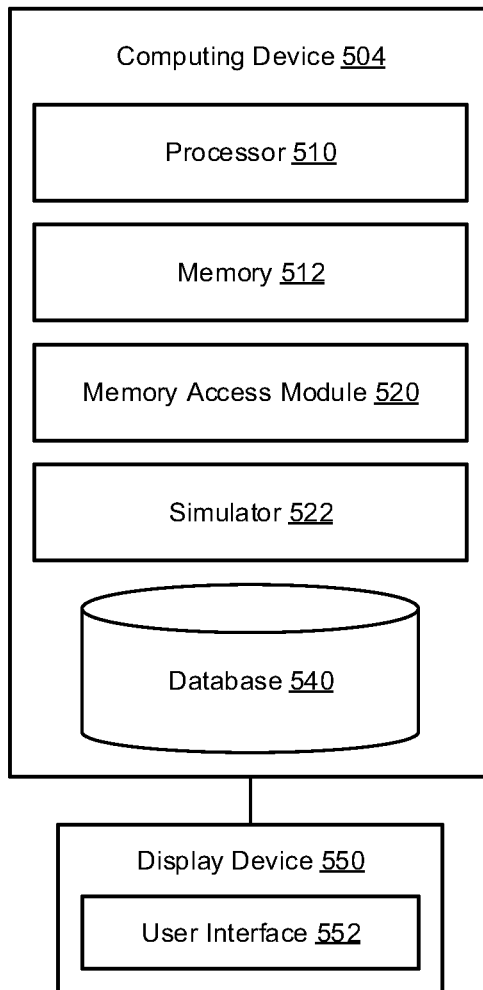
FIG. 5 illustrates a diagram of a computer system for providing read and write memory access schemes and techniques in physical layout design in accordance with various implementations described herein.

FIG. 5 illustrates a diagram of a computer system 500 for providing read and write access schemes and techniques in physical memory designs in accordance with various implementations described herein.

In reference to FIG. 5, the system 500 may be associated with at least one computing device 504 that is implemented as a special purpose machine configured for implementing read and write access techniques in physical design. In some instances, the computing device 504 may include any standard element(s) and/or component(s), including at least one processor 510, memory 512 (e.g., non-transitory computer-readable storage medium), one or more database(s) 540, power, peripherals, and various other computing elements and/or components that may not be specifically shown in FIG. 5. Also, the computing device 504 may include instructions recorded or stored on the non-transitory computer-readable medium 512 that are executable by the at least one processor 510. The computing device 504 may be associated with a display device 550 (e.g., a monitor or other display) that may be used to provide a user interface (UI) 552, such as, e.g., a graphical user interface (GUI). In some instances, the UI or GUI 552 may be configured to receive various parameters and/or preferences from a user for managing, operating, and/or controlling the computing device 504. Thus, the computing device 504 may include the display device 550 for providing output to a user, and also, the display device 550 may include the UI 552 for receiving input from the user.

In reference to FIG. 5, the computing device 504 may have a memory access module 520 that may be configured to cause the at least one processor 510 to implement various schemes and techniques described herein in reference to FIGS. 1A-4, including various read and write memory access schemes and techniques related to implementing integrated circuitry in physical layout design. The memory access module 520 may be implemented in hardware and/or software. In some instances, if implemented in software, the memory access module 520 may be stored in memory 512 or database 540. Also, in other instances, if implemented in hardware, the memory access module 520 may be a separate processing component that is configured to interface with the processor 510.

In some instances, the memory access module 520 may be configured to cause the processor 510 to perform various operations, as provided herein in reference to read and write access schemes and techniques described in FIGS. 1A-4. In this instance, the memory 512 has stored thereon instructions that, when executed by the processor 510, cause the processor 510 to perform one or more of the following operations.

For instance, the memory access module 520 may be configured to cause the at least one processor 510 to access single port memory having multiple different banks having a first bank and a second bank that is different than the first bank. The memory access module 520 may be configured to cause the at least one processor 510 to access multiple wordlines of the single port memory by accessing a first wordline coupled to the first bank and accessing a second wordline coupled to the second bank. The memory access module 520 may be configured to cause the at least one processor 510 to perform multiple memory access operations concurrently in the single port memory by performing a read operation in the first bank using the first wordline while performing a write operation in the second bank using the second wordline, or performing a write operation in the first bank using the first wordline while performing a read operation in the second bank using the second wordline. In some implementations, the same memory address may be used to perform the multiple memory access operations concurrently in the single port memory, and also, the same memory address may refer to the same row address in the first bank and the second bank.

In accordance with various implementations described herein in reference to FIGS. 1A-4, any one or more or all of these operations performed by the memory access module 520 may be altered, modified, changed and/or updated so as to thereby provide various specific embodiments as shown in FIGS. 1A-4. Also, in some instances, each of the circuit components may be in a form of a physical structure having various shapes with length, width and/or various other spatial definitions, and the physical structure may be associated with an integrated circuit that is included in a place and route environment for DRC and various rules associated therewith.

Further, in reference to FIG. 5, the computing device 504 may include a simulator 522 that is configured to cause the at least one processor 510 to generate one or more simulations of the circuit layout and related components. The simulator 522 may be referred to as a simulating component or module that may be implemented in hardware or software. If implemented in software, the simulator 522 may be recorded and/or stored in memory 512 or database 540. If implemented in hardware, the simulator 520 may be a separate processing component configured to interface with the processor 510. In some instances, the simulator 522 may refer to a SPICE simulator that is configured to generate SPICE simulations of the cell layout and related components. Generally, SPICE refers to an acronym for Simulation Program with Integrated Circuit Emphasis, which is an open source analog electronic circuit simulator. Also, SPICE may refer to a general-purpose software program used by the semiconductor industry to check the integrity of physical structure designs and to predict the behavior of physical structure designs. Thus, the memory access module 520 may be configured to interface with the simulator 522 so as to generate various timing data based on one or more simulations (including, e.g., SPICE simulations) of the circuit layout and related components that are used for analyzing performance characteristics of the integrated circuit including timing data of the circuit layout and related components. Also, the memory access module 520 may be configured to use the one or more simulations (including, e.g., SPICE simulations) of the circuit layout and related components for evaluating operating behavior and conditions thereof.

In some implementations, the computing device 504 may include one or more databases 540 configured to store and/or record various data and information related to implementing read and write access techniques in physical design. In various instances, the database(s) 540 may be configured to store and/or record data and information related to integrated circuitry, operating conditions, operating behavior and/or timing data of the circuit layout and related components. Also, the database(s) 540 may be configured to store data and information related to the circuit layout and related components and timing data in reference to simulation data (including, e.g., SPICE simulation data).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method. The method may include providing single port memory with multiple different banks having a first bank and a second bank that is different than the first bank. The method may include coupling multiple wordlines to the single port memory including coupling a first wordline to the first bank and coupling a second wordline to the second bank. The method may include performing multiple memory access operations concurrently in the single port memory including performing a read operation in the first bank using the first wordline while performing a write operation in the second bank using the second wordline, or performing a write operation in the first bank using the first wordline while performing a read operation in the second bank using the second wordline. In some instances, the first wordline in the first bank and the second wordline in the second bank share the same row address but have a different write bank address (WBA) and a different read bank address (RBA).

Described herein are various implementations of a device. The device may include single port memory architecture having multiple bitcell arrays having a first bitcell array and a second bitcell array that is different than the first bitcell array. The device may include a first wordline coupled to the first bitcell array and a second wordline coupled to the second bitcell array. The device may include logic circuitry that performs multiple memory access operations concurrently in the single port memory architecture including performing a read operation in the first bitcell array using the first wordline while performing a write operation in the second bitcell array using the second wordline, or performing a write operation in the first bitcell array using the first wordline while performing a read operation in the second bitcell array using the second wordline.

Described herein are various implementations of a system. The system may include a processor and memory having stored thereon instructions that, when executed by the processor, cause the processor to access single port memory having multiple different banks having a first bank and a second bank that is different than the first bank. The instructions may cause the processor to access multiple wordlines of the single port memory by accessing a first wordline coupled to the first bank and accessing a second wordline coupled to the second bank. The instructions may cause the processor to perform multiple memory access operations concurrently in the single port memory by performing a read operation in the first bank using the first wordline while performing a write operation in the second bank using the second wordline, or performing a write operation in the first bank using the first wordline while performing a read operation in the second bank using the second wordline.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
   providing single port memory with a plurality of different banks having a first bank of bitcells and a second bank of bitcells that is different than the first bank of bitcells;
   coupling a plurality of wordlines to the single port memory including coupling a first wordline to each bitcell in the first bank and coupling a second wordline to each bitcell in the second bank;
   coupling a plurality of shared bitlines to the single port memory including coupling a plurality of first shared bitlines to each bitcell in the first bank and coupling a plurality of second shared bitlines to each bitcell in the second bank;
   coupling a plurality of shared read bitlines to the single port memory including coupling a plurality of first shared read bitlines to the first shared bitlines for each bitcell in the first bank and coupling a plurality of second shared read bitlines to the second shared bitlines for each bitcell in the second bank; and
   performing a plurality of memory access operations concurrently in the single port memory including performing a read operation in the first bank using the first wordline and the plurality of first shared read bitlines while performing a write operation in the second bank using the second wordline and the plurality of second shared bitlines, or performing a write operation in the first bank using the first wordline and the plurality of first shared bitlines while performing a read operation in the second bank using the second wordline and the plurality of second read shared bitlines.

2. The method of claim 1, wherein a same memory address is used to perform the plurality of memory access operations concurrently in the single port memory, and wherein a row address corresponds to the same memory address in the first bank and the second bank, and wherein the row address is used to perform the plurality of memory access operations concurrently in the single port memory.

3. The method of claim 1, wherein the same memory location in the first bank and the second bank is used to concurrently perform the plurality of memory access operations in the single port memory.

4. The method of claim 1, wherein the read operation is performed in the first bank with a memory address while the write operation is performed concurrently in the second bank with the memory address.

5. The method of claim 1, wherein the write operation is performed in the first bank with a memory address while the read operation is performed concurrently in the second bank with the memory address.

6. The method of claim 1, wherein a global write enable signal (GWEN), a write bank address (WBA), a row address and a first column address are used to perform the write operation in the first bank, and wherein the GWEN is gated with a decoded select line or a column address bit to generate a signal for a write multiplexer.

7. The method of claim 1, wherein a global read enable signal (GREN), a read bank address (RBA), the row address and a second column address are used to perform the read operation in the second bank, and wherein the GREN is gated with a decoded select line or a column address bit to generate a signal for a read multiplexer.

8. The method of claim 1, wherein the first bank of bitcells is arranged as a first array of bitcells in columns and rows, and wherein the second bank of bitcells is arranged as a second array of bitcells in columns and rows.

9. The method of claim 8, wherein the single port memory refers to static random access memory (SRAM) or magneto-resistive RAM (MRAM), and wherein the bitcells refer to SRAM bitcells or MRAM bitcells.

10. A device, comprising:
single port memory architecture having a plurality of bitcell arrays including a first bitcell array and a second bitcell array that is different than the first bitcell array;
a first wordline coupled to each bitcell in the first bitcell array and a second wordline coupled to each bitcell in the second bitcell array;
a plurality of first shared bitlines coupled to each bitcell in the first bank and a plurality of second shared bitlines coupled to each bitcell in the second bank; and
a plurality of first shared read bitlines coupled to the first shared bitlines in the first bank and a plurality of second shared read bitlines coupled to the second shared bitlines in the second bank; and
logic circuitry that performs a plurality of memory access operations concurrently in the single port memory architecture including performing a read operation in the first bitcell array using the first wordline and the plurality of first shared read bitlines while performing a write operation in the second bitcell array using the second wordline and the plurality of second shared bitlines, or performing a write operation in the first bitcell array using the first wordline and the plurality of first shared bitlines while performing a read operation in the second bitcell array using the second wordline and the plurality of second shared read bitlines.

11. The device of claim 10,
wherein a global write enable signal (GWEN), a write bank address (WBA), a row address and a first column address are used to perform the write operation in the first bank, and wherein a global read enable signal (GREN), a read bank address (RBA), the row address and a second column address are used to perform the read operation in the second bank.

12. The device of claim 10, wherein the read operation is performed in the first bitcell array with a memory address while the write operation is performed concurrently in the second bitcell array with the memory address, and wherein the write operation is performed in the first bitcell array with a memory address while the read operation is performed concurrently in the second bitcell array with the memory address.

13. The device of claim 10, wherein the bitcells in the first bitcell array are arranged in columns and rows, and wherein the bitcells in the second bitcell array are arranged in columns and rows.

14. The device of claim 10, wherein the single port memory architecture refers to static random access memory (SRAM) or magneto-resistive RAM (MRAM), and wherein the first bitcell array and the second bitcell array include SRAM bitcells or MRAM bitcells.

15. A system, comprising:
a processor; and
memory having stored thereon instructions that, when executed by the processor, cause the processor to:
access single port memory having a plurality of different banks with a first bank of bitcells and a second bank of bitcells that is different than the first bank of bitcells;
access a plurality of wordlines of the single port memory by accessing a first wordline coupled to each bitcell in the first bank and accessing a second wordline coupled to each bitcell in the second bank;
access a plurality of shared bitlines of the single port memory by accessing a plurality of first shared bitlines coupled to each bitcell in the first bank and by accessing a plurality of second shared bitlines coupled to each bitcell in the second bank;
access a plurality of shared read bitlines of the single port memory by accessing a plurality of first shared read bitlines coupled to the first shared bitlines in the first bank and by accessing a plurality of second shared read bitlines coupled to the second shared bitlines in the second bank; and
perform a plurality of memory access operations concurrently in the single port memory by performing a read operation in the first bank using the first wordline and the plurality of first shared read bitlines while performing a write operation in the second bank using the second wordline and the plurality of second shared bitlines, or performing a write operation in the first bank using the first wordline and the plurality of first shared bitlines while performing a read operation in the second bank using the second wordline and the plurality of second shared read bitlines.

16. The system of claim 15, wherein a same memory address is used to perform the plurality of memory access operations concurrently in the single port memory, and wherein a row address corresponds to the same memory address in the first bank and the second bank, and wherein the row address is used to perform the plurality of memory access operations concurrently in the single port memory.

17. The system of claim 15, wherein the read operation is performed in the first bank with a read bank address (RBA), a row address, and a column address while the write operation is performed concurrently in the second bank with a write bank address (WBA), the row address, and the column address, and wherein the write operation is performed in the first bank with the WBA, the row address, and the column address while the read operation is performed concurrently in the second bank with the RBA, the row address and the column address.

18. The system of claim 15, wherein a global write enable signal (GWEN), a write bank address (WBA), a row address, and a column address are used to perform the write operation in the first bank, and wherein a global read enable signal (GREN), a read bank address (RBA), the row address, and the column address are used to perform the read operation in the second bank, and wherein the global write enable signal (GWEN), the write bank address (WBA), the row address, and the column address are used to perform the write operation in the second bank, and wherein the global read enable signal (GREN), the read bank address (RBA), the row address, and the column address are used to perform the read operation in the first bank.

19. The system of claim 15, wherein the single port memory refers to static random access memory (SRAM) or magneto-resistive RAM (MRAM), and wherein the first bank and the second bank include SRAM bitcells or MRAM bitcells.

\* \* \* \* \*